United States Patent
Chen et al.

(10) Patent No.: US 9,074,169 B2
(45) Date of Patent: Jul. 7, 2015

(54) LITHOGRAPHIC TOOL IN SITU CLEAN FORMULATIONS

(75) Inventors: Tianniu Chen, Rocky Hill, CT (US);
Steven Bilodeau, Oxford, CT (US);
Karl E. Boggs, Hopewell Junction, NY (US); Ping Jiang, Danbury, CT (US);
Michael B. Korzenski, Danbury, CT (US); George Mirth, Saratoga, CA (US); Kim Y. Van Berkel, Mountain View, CA (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 63 days.

(21) Appl. No.: 13/146,438

(22) PCT Filed: Jan. 26, 2010

(86) PCT No.: PCT/US2010/022050
§ 371 (c)(1),
(2), (4) Date: Sep. 1, 2011

(87) PCT Pub. No.: WO2010/088194
PCT Pub. Date: Aug. 5, 2010

(65) Prior Publication Data
US 2012/0015857 A1  Jan. 19, 2012

Related U.S. Application Data

(60) Provisional application No. 61/147,859, filed on Jan. 28, 2009, provisional application No. 61/158,166, filed on Mar. 6, 2009, provisional application No. 61/235,711, filed on Aug. 21, 2009.

(51) Int. Cl.
*C11D 11/00* (2006.01)
*C11D 1/66* (2006.01)
*C11D 3/43* (2006.01)

(52) U.S. Cl.
CPC .............. *C11D 11/0041* (2013.01); *C11D 1/66* (2013.01); *C11D 3/43* (2013.01); *C11D 11/0047* (2013.01)

(58) Field of Classification Search
CPC .................................................... C11D 11/0047
USPC .................................................... 510/175, 176
See application file for complete search history.

(56) References Cited

U.S. PATENT DOCUMENTS

| | | |
|---|---|---|
| 4,780,235 A | 10/1988 | Jackson |
| 4,781,916 A | 11/1988 | Papaphilippou |

(Continued)

FOREIGN PATENT DOCUMENTS

| | | |
|---|---|---|
| EP | 1722275 A1 | 11/2006 |
| EP | 1962327 A1 | 8/2008 |

(Continued)

OTHER PUBLICATIONS

Mulkens, Jan, et al.; "Defects, Overlay and Focus Performance Improvements with Five Generations of Immersion Exposure Systems," Proc Spie 6520, Optical Microlithography XX, 652005 (Mar. 19, 2007); doi:10.1117/12.713577; http://dx.doi.org/10.1117/12.713577.

(Continued)

*Primary Examiner* — Gregory Webb
(74) *Attorney, Agent, or Firm* — Tristan A. Fuierer; Moore & Van Allen, PLLC; Rosa Yaghmour

(57) ABSTRACT

Compositions and methods of using said composition for removing polymeric materials from surfaces, preferably cleaning contaminant buildup from a lithography apparatus without total disassembly of said apparatus.

16 Claims, 1 Drawing Sheet

(56) References Cited

U.S. PATENT DOCUMENTS

| | | | |
|---|---|---|---|
| 5,712,237 A | 1/1998 | Stevens | |
| 5,746,836 A | 5/1998 | Fukai | |
| 6,339,053 B1 | 1/2002 | Chivers et al. | |
| 6,368,358 B1 | 4/2002 | Glenn et al. | |
| 6,962,714 B2* | 11/2005 | Hei et al. | 424/405 |
| 7,078,157 B2* | 7/2006 | Zhuang et al. | 430/281.1 |
| 7,129,199 B2 | 10/2006 | Zhang et al. | |
| 7,309,684 B2* | 12/2007 | Filippini et al. | 510/201 |
| 7,362,412 B2 | 4/2008 | Holmes et al. | |
| 7,522,259 B2 | 4/2009 | Hazelton et al. | |
| 7,648,819 B2 | 1/2010 | Holmes et al. | |
| 2003/0196685 A1 | 10/2003 | Anzures et al. | |
| 2003/0199406 A1 | 10/2003 | Anzures et al. | |
| 2003/0215755 A1* | 11/2003 | Lundy et al. | 430/331 |
| 2004/0009889 A1 | 1/2004 | Tropsch et al. | |
| 2004/0029395 A1 | 2/2004 | Zhang et al. | |
| 2004/0029396 A1 | 2/2004 | Zhang et al. | |
| 2004/0204328 A1 | 10/2004 | Zhang et al. | |
| 2005/0029490 A1 | 2/2005 | Subawalla et al. | |
| 2005/0205108 A1 | 9/2005 | Chang et al. | |
| 2005/0238677 A1 | 10/2005 | Mercier et al. | |
| 2006/0028628 A1 | 2/2006 | Lin et al. | |
| 2006/0258555 A1* | 11/2006 | Filippini et al. | 510/417 |
| 2006/0293201 A1* | 12/2006 | Simon et al. | 510/235 |
| 2007/0010409 A1 | 1/2007 | Zhang et al. | |
| 2007/0010412 A1 | 1/2007 | Zhang et al. | |
| 2007/0049510 A1* | 3/2007 | Fujii et al. | 510/201 |
| 2007/0132968 A1 | 6/2007 | Kobayashi et al. | |
| 2007/0148589 A1* | 6/2007 | Kanda et al. | 430/270.1 |
| 2008/0171287 A1* | 7/2008 | Kanda et al. | 430/270.1 |
| 2008/0230095 A1* | 9/2008 | McKechnie | 134/42 |
| 2008/0271747 A1 | 11/2008 | De Jong et al. | |
| 2009/0004608 A1 | 1/2009 | Sawada et al. | |
| 2009/0301996 A1* | 12/2009 | Visintin et al. | 216/13 |
| 2010/0261632 A1* | 10/2010 | Korzenski et al. | 510/175 |
| 2011/0229424 A1 | 9/2011 | Schumann et al. | |
| 2012/0064011 A1 | 3/2012 | Schumann | |
| 2012/0085371 A1 | 4/2012 | Schumann et al. | |

FOREIGN PATENT DOCUMENTS

| | | |
|---|---|---|
| JP | 55157700 | 12/1980 |
| JP | 09-165600 | 6/1997 |
| WO | 9008603 A1 | 8/1990 |
| WO | 2005108383 A2 | 11/2005 |
| WO | 2008061384 A1 | 5/2008 |

OTHER PUBLICATIONS

The HLB System, website, http://www.lotioncrafter.com/pdf/The_HLB_System.pdf, pp. 5, 7, 23 and 28-32.

Taiwanese Search Report, May 22, 2014.

* cited by examiner

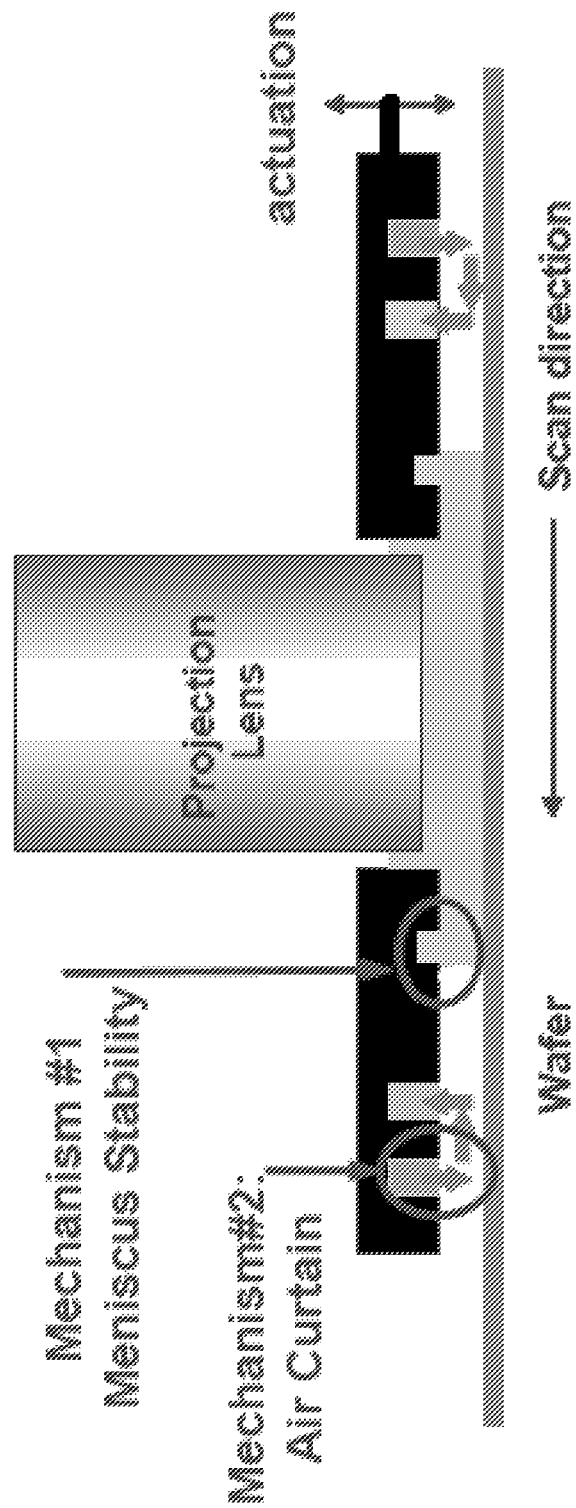

LITHOGRAPHIC TOOL IN SITU CLEAN FORMULATIONS

CROSS-REFERENCE TO RELATED APPLICATIONS

This application is filed under the provisions of 35 U.S.C. §371 and claims the priority of International Patent Application No. PCT/US2010/022050 filed on 26 Jan. 2010 in the name of Tianniu Chen et al. and entitled "Lithographic Tool In Situ Clean Formulations" which claims priority to U.S. Provisional Patent Application Nos. 61/147,859 filed on 28 Jan. 2009, 61/158,166 filed on 6 Mar. 2009 and 61/235,711 filed 21 Aug. 2009, all of which are hereby incorporated herein by reference in their entireties.

FIELD

The present invention relates generally to compositions and processes useful for removing polymeric materials from surfaces, e.g., cleaning contaminant buildup from a lithography apparatus without total disassembly of said apparatus.

DESCRIPTION OF THE RELATED ART

The semiconductor integrated circuit (IC) technology has experienced rapid progress including the continued minimization of feature size and maximization of packing density. The minimization of feature size relies on the improvement in photolithography and its ability to print smaller features. The minimum feature size in an optical lithography system may be determined in part by diffraction, which is related to the wavelength of light and the medium through which the light shines. One approach to reducing feature size and improving resolution is to use light with a shorter wavelength. Another approach is to use a medium between the lens and the substrate other than air. Since the index of refraction ("n") of a medium is larger than one, the wavelength in the medium is reduced by the factor of n, which may improve resolution. One such method of enhancing resolution using a non-air medium is referred to as immersion lithography. Commonly used immersion lithography adopts water (preferably high purity water) as media.

Although lithographic systems are operated in clean rooms and flushed with clean air, contamination of the apparatus does occur and, depending on the location and type of contaminant, causes various problems. A major source of contamination includes immersion media-induced (e.g., water) shedding of polymeric material (e.g., resist) particles from the surface of the wafer. In addition, inorganic contaminants on the mask deriving from the air in the clean room or from manufacture, transportation and storage of the mask can cause localized absorption of the projection beam leading to dose errors and improper imaging of mask features or even printing of marks in what should be blank areas. Particulates on the substrate table can distort the substrate leading to localized focus errors (known as hot spots). In addition to the ambient air and the manufacture of masks and substrates, sources of contamination include resist debris sputtered from the substrate by the projection beam during exposures, and mechanical contact between moving parts of the apparatus, which may cause particulates to be dislodged from the contacting surfaces. Contamination may also include metal and/or oxide particles. Further, the liquid may lift debris or particles (e.g. left over from the manufacturing process) from parts of the lithographic apparatus and/or substrates or erode components so as to introduce particles. This debris may then be left behind on the substrate or the lens after imaging or may interfere with the imaging while in suspension in the liquid between the projection system and the substrate. Thus, the issue of contamination should be addressed in an immersion lithographic apparatus.

Currently, the cleaning of the lithographic apparatuses is achieved mainly by taking the apparatus offline and disassembling the entire tool. Accordingly, the cleaning of the apparatus and its components is time consuming and costly, both in terms of actual labor but also in terms of downtime losses.

Recently, cleaning tools designed to clean a surface of a component of a lithographic apparatus have been disclosed, however, to date, the compositions used in said cleaning tools have not effectively or efficiently removed the contamination from the components of the lithographic apparatus.

SUMMARY

The present invention relates generally to a composition and a method for effectively removing polymeric material from a surface, for example, cleaning an immersion lithograph system in situ without total disassembly of said apparatus.

In one aspect, a composition comprising at least one organic solvent and at least one non-ionic surfactant is described. The composition may further comprise contaminant material.

In another aspect, a composition consisting of at least one organic solvent and at least one non-ionic surfactant is described.

In still another aspect, a composition comprising at least one organic solvent, at least one non-ionic surfactant and at least one glycol ether is described. The composition may further comprise contaminant material.

In yet another aspect, a composition consisting of at least one organic solvent, at least one non-ionic surfactant and at least one glycol ether is described.

Another aspect relates to a composition comprising at least one organic solvent, at least one non-ionic surfactant and water. The composition may further comprise contaminant material.

Still another aspect relates to a composition consisting of at least one organic solvent, at least one non-ionic surfactant and water.

Yet another aspect relates to a composition comprising at least one organic solvent, at least one non-ionic surfactant, at least one glycol ether, and water. The composition may further comprise contaminant material.

Another aspect relates to a composition consisting of at least one organic solvent, at least one non-ionic surfactant, at least one glycol ether and water.

In another aspect, a method of removing contaminant material from a component of a lithographic apparatus having said contaminant material thereon is described, said method comprising contacting the composition of a composition comprising at least one organic solvent and at least one non-ionic surfactant with said component to remove said contaminant material from said component.

In still another aspect, a kit is described, said kit comprising, in one or more containers, one or more of the following reagents for forming a composition, wherein said composition comprises at least one organic solvent and at least one non-ionic surfactant, wherein the kit is adapted to form a composition suitable for removing contaminant material from a component of a lithographic apparatus.

Other aspects, features and embodiments of the invention will be more fully apparent from the ensuing disclosure and appended claims.

BRIEF DESCRIPTION OF THE DRAWINGS

FIG. 1 is a schematic of the immersion lithography apparatus (Mulkens, Jan, et al., "Defects, Overlay and Focus Performance Improvements with Five Generations of Immersion Exposure Systems," Society of Photographic Instrumentation Engineers (SPIE) 2007).

DETAILED DESCRIPTION AND PREFERRED EMBODIMENTS THEREOF

The present invention generally relates to a composition and method for removing polymeric material and its related byproducts from a surface, for example, for the in situ cleaning of the components of an immersion lithograph system.

As defined herein, "photoresist precursors" include the film-forming photoresist resins known to those skilled in the art, photoactive compounds, photoinitiators, cross-linking compounds, related byproducts and combinations of any of the above. The film-forming resins may include, but are not limited to, resins useful for forming positive, negative or thick photoresist.

As defined herein, "non-aqueous" corresponds to a composition that is substantially devoid of added water. For example, it is understood that some chemical components naturally include negligible amounts of water when in their lowest energy, i.e., stable, state. Naturally present water is not considered added water.

As used herein, the term "semi-aqueous" refers to a mixture of water and organic components and can include additional components present therein.

"Substantially devoid" is defined herein as less than 5 wt. %, preferably less than 1 wt. %, more preferably less than 0.5 wt. %, and most preferably less than 0.1 wt. %, based on the total weight of the composition.

As used herein, "about" is intended to correspond to ±5% of the stated value.

As used herein, "suitability" for removing contaminant material from the components of a lithographic apparatus, corresponds to at least partial removal of said contaminant material from said components. Preferably, at least 90% of the contaminant material is removed using the compositions described herein, more preferably, at least 95%, and most preferably at least 99% of the contaminant material, is removed.

As defined herein, "contaminant material" corresponds to polymeric materials including, but not limited to, photoresist, top-coating, anti-reflective coatings, particles generated by the lithographic apparatus (e.g., polymeric, metal and/or oxide particles being exposed to the light), and combinations thereof.

The term "lens," where the context allows, may refer to any one or combination of various types of optical components, including refractive, reflective, magnetic, electromagnetic and electrostatic optical components.

The term "upstream" of the site of cleaning corresponds to a region that is a part of the tool itself or a container that is in fluid (i.e., liquid, gas) communication with the tool and the site of cleaning.

As defined herein, "dibasic ester" can be a single dibasic ester species (e.g., dimethyl glutarate; dimethyl adipate; dimethyl succinate; diethyl phthalate; diethyl succinate; dibutyl succinate; diethyl adipate; diethyl glutarate; dibutyl phthalate; diethyl tartarate; diocytl phthalate) or a combination of said species, as understood by those skilled in the art. For example, a common mixture of dibasic esters comprises dimethyl glutarate, dimethyl adipate, and dimethyl succinate.

As defined herein, "carbonate" can be a single carbonate species (e.g., propylene carbonate, butylene carbonate, glycerine carbonate) or a combination of said species, as understood by those skilled in the art.

Lithographic apparatuses may be of a reflective type (e.g. employing a reflective mask). Alternatively, the apparatus may be of a transmissive type (e.g. employing a transmissive mask). The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The lithographic apparatus may also be of a type wherein at least a portion of the substrate may be covered by a liquid having a relatively high refractive index, e.g. water, so as to fill a space between the projection system and the substrate (see, e.g., FIG. 1). An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Compositions may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Cleaning tools designed to clean components of a lithographic apparatus have been disclosed, however, to date, the compositions used in said cleaning tools have not effectively or efficiently removed the contamination from the components of the lithographic apparatus. An example of said cleaning tools include the disclosure of U.S. Publication No. 20080271747 in the name of de Jong et al. entitled "Cleaning Device and a Lithographic Apparatus Cleaning Method," which is hereby incorporated by reference in its entirety.

In general, the compositions described herein include at least one organic solvent, preferably at least one organic solvent and at least one surfactant, wherein the compositions are useful for the removal of polymeric materials from surfaces.

In one aspect, a concentrate composition comprising, consisting of, or consisting essentially of at least one organic solvent and at least one surfactant is described, wherein the concentrate composition is useful for the removal of contaminants from the components of a lithographic apparatus. The concentrate composition may be semi-aqueous or non-aqueous, as readily determined by one skilled in the art. Accordingly, the concentrate composition can comprise, consist of or consist essentially of at least one organic solvent, at least one surfactant, and water. In general, the specific proportions and amounts of components, in relation to each other, may be suitably varied to provide the desired removal action of the concentrate composition, either neat or upon dilution, for the contaminants and/or processing equipment, as readily determinable within the skill of the art without undue effort. In a particularly preferred embodiment, the surfactant comprises, consists of, or consists essentially of a non-ionic surfactant.

In one embodiment, a non-aqueous concentrate composition comprising, consisting of, or consisting essentially of at least one organic solvent and at least one non-ionic surfactant is described. In another embodiment, a semi-aqueous concentrate composition comprising, consisting of, or consisting essentially of at least one organic solvent, at least one non-ionic surfactant, and added water is described. In yet another embodiment, a concentrate composition comprising, consisting of, or consisting essentially of a first organic solvent, at least one non-ionic surfactant, and a second organic solvent is described, wherein the boiling point of the second organic solvent is greater than that of the first organic solvent so as to raise the flash point of the concentrate composition. Yet another embodiment relates to an aqueous composition comprising, consisting of, or consisting essentially of a first organic solvent, at least one non-ionic surfactant, a second organic solvent and added water. In still another embodiment, a non-aqueous concentrate composition comprising, consisting of, or consisting essentially of at least one organic solvent, a first non-ionic surfactant, and a second non-ionic surfactant is described. Another embodiment relates to a semi-aqueous composition comprising, consisting of, or consisting essentially of at least one organic solvent, a first non-ionic surfactant, a second non-ionic surfactant, and added water is described. In yet another embodiment, a non-aqueous concentrate composition comprising, consisting of, or consisting essentially of at least two organic solvents, a first non-ionic surfactant, and a second non-ionic surfactant is described. Another embodiment relates to a semi-aqueous composition comprising, consisting of, or consisting essentially of at least two organic solvents, a first non-ionic surfactant, a second non-ionic surfactant, and added water is described. In each of these embodiments, the concentrate composition may further include at least one defoaming agent. Alternatively, in each of the foregoing embodiments, at least one additional component may be added including, but not limited to, at least one buffering agent, at least one oxidant (e.g., peroxides, ozone, $CO_2$, $XeF_2$), at least one chelating agent (e.g., diamines, triamines, other multidentate ligands), at least one algicide/microbial inhibitor, at least one static charge remover, at least one acid/base, at least one defoaming agent, at least one plasticizer, and any combination thereof. For example, in another embodiment, a non-aqueous concentrate composition comprising, consisting of, or consisting essentially of at least one organic solvent, at least one non-ionic surfactant and at least one plasticizer is described. In another embodiment, a semi-aqueous concentrate composition comprising, consisting of, or consisting essentially of at least one organic solvent, at least one non-ionic surfactant, at least one plasticizer, and added water is described. In general, the specific proportions and amounts of components, in relation to each other, may be suitably varied to provide the desired removal action of the concentrate composition, either neat or upon dilution, for the contaminants and/or processing equipment, as readily determinable within the skill of the art without undue effort.

Organic solvents preferred for the compositions described herein include ketones such as, but not limited to, cyclohexanone, acetylacetone, 3-pentanone, acetone, 5-hydroxy-2-pentanone, 2,5-hexanedione, 4-hydroxy-4-methyl-2-pentanone, butanone, 2-methyl-2-butanone, 4-hydroxy-2-butanone, cyclopentanone, 2-pentanone, 1-phenylethanone, benzophenone, 2-hexanone, 3-hexanone, 2-heptanone, 4-heptanone, ethyl n-butyl ketone, ethyl n-amyl ketone, methyl isopropyl ketone, diethylketone, dicyclohexyl ketone, 2,6-dimethylcyclohexanone, 2-acetylcyclohexanone, 2,4-pentanedione, and combinations thereof. Alternatively, or in addition to, the organic solvent may include alcohols (e.g., tetrahydrofurfuryl alcohol), hydrocarbons, glycols, glycol ethers, sulfones and other sulfur-containing compounds (e.g., tetramethylene sulfone, dimethyl sulfone, dimethylsulfoxide), esters (e.g., dibasic esters, dimethyl glutarate, dimethyl adipate, dimethyl succinate), aldehydes, lactones (e.g., γ-butyrolactone), pyrrolidones (e.g., 1-cyclohexyl-2-pyrrolidinone), carboxylic acids, carbonates (e.g., butylene carbonate, propylene carbonate, glycerine carbonate, and any combination of butylene carbonate, propylene carbonate, glycerine carbonate etc.), dibasic esters (e.g., dimethyl glutarate; dimethyl adipate; dimethyl succinate any combination of dimethyl glutarate, dimethyl adipate and dimethyl succinate; diethyl phthalate; diethyl succinate; dibutyl succinate; diethyl adipate; diethyl glutarate; dibutyl phthalate; diethyl tartarate; diocytl phthalate) and combinations thereof. Preferably, the organic solvent(s) are highly nucleophilic and include at least one carbonyl group, whereby there is a high electronic density on the oxygen atoms of the carbonyl group, while at the same time having minimal steric bulkiness around the carbonyl group. Preferred organic solvents include dibasic esters, alkylene carbonates, glycerine carbonate, propylene carbonate, butylene carbonate, and combinations thereof. Other preferred organic solvents include any one of (1) cyclohexanone, (2) 3-pentanone, (3) dibasic ester, (4) dimethyl adipate, (5) butylene carbonate, (6) propylene carbonate, (7) glycerine carbonate, or (8) glycerine carbonate and dibasic esters.

In another embodiment, a second organic solvent is present, wherein the boiling point of the second organic solvent is greater than that of the first organic solvent so as to raise the flash point of the concentrate composition. For example, a first organic solvent can comprise, consist of, or consist essentially of a ketone, an ester, a lactone, an aldehyde, a pyrrolidinone, a carboxylic acid, or a carbonate, or combinations thereof, as described herein, and a second organic solvent for raising the flash point comprises, consists of, or consists essentially of at least one glycol ether. Preferred glycol ethers include, but are not limited to, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether, dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

Surfactants contemplated include nonionic, anionic, cationic (based on quaternary ammonium cations) and/or zwitterionic surfactants. Preferred criteria for a first surfactant included in the composition described herein include miscibility with water, a surface tension greater than 30 dynes/cm at 25° C., an HLB greater than 10, and a foaming height less than 5 cm at room temperature at concentrations of approximately 0.5 wt %, based on the total weight of the composition. For example and preferably, suitable non-ionic surfactants may include fluorosurfactants, ethoxylated fluorosurfactants, polyoxyethylene-polyoxypropylene block co-polymers, alkylphenol ethoxylates, castor oil ethoxylates, fatty acid ethoxylates, alkyl ethoxylates, alkylphenyl ethoxylates, polyoxyethyleneglycol dodecyl ethers, fluorinated polyethers, as well as combinations comprising at least one of the foregoing. For example, the nonionic surfactant may be an ethoxylated fluorosurfactant such as ZONYL® FSO-100 or FSN-100 fluorosurfactants (DuPont Canada Inc., Mississauga, Ontario, Canada), a polyoxyethylene-polyoxypropylene block co-polymers such as PLURONIC® 17R4 or 25R4 (BASF), a polyoxyethyleneglycol dodecyl ether such as BRIJ® 35P, a alkylphenol ethoxylate such as TRITON® X-100, a castor oil ethoxylate such as SURFONIC® CO (Huntsmen Chemical, Tex., USA), a fatty acid ethoxylate such as SURFONIC® E-400 MO (Huntsmen Chemical, Tex., USA), DYNOL® 604 (Air Products), a fluorinated polyether such as POLYFOX™ PF-159 (Omnova Solutions, Inc.), and combinations thereof. Preferably, the nonionic surfactant may be ZONYL® FSO-100, FSN-100, PLURONIC® 17R4, PLURONIC® 25R4, BRIJ® 35P, SURFONIC® CO-42, SURFONIC® E-400 MO, POLYFOX™ PF-159 and combinations thereof. Alternatively, or in addition, the surfactant may comprises a sucrose ester (e.g., sucrose stearate, sucrose palmitate, sucrose cocoate, sucrose laurate, sucrose distearate, sucrose dipalmitate, sucrose dicocoate, sucrose dilaurate, mixed diesters, and mixtures thereof), an ethoxylated fatty alcohol, a polyethoxylated fatty alcohol, a glycerol monofatty acid ester, a fatty acid ester of polyethylene glycol, a polyethoxylated sorbitan fatty acid ester, an alkylglycosides, an alkylpolyoside, a mid-chain branched alcohol, polyvinyl alcohols, ethers, pyrrolidones, monoglycerides, sorbitan esters (e.g., sorbitan monolaurate, sorbitan monopalmitate, sorbitan monostearate, sorbitan tristearate, sorbitan monooleate, sorbitan trioleate), polysorbate surfactants (e.g., polyoxyethylene (20) sorbitan monolaurate, polyoxyethylene (20) sorbitan monopalmitate, polyoxyethylene (20) sorbitan monostearate, polyoxyethylene (20) sorbitan monooleate, polyoxyethylene sorbitan trioleate, polyoxyethylene sorbitan tristearate) non-hydroxyl-terminated non-ionic surfactants and combinations thereof. Preferably, the surfactant comprises a fluorinated polyether, a polysorbate surfactant, a sorbitan ester, a mixture of polysorbate surfactant and sorbitan ester, or a mixture of polyoxyethylene sorbitan monooleate and sorbitan monooleate.

In a particularly preferred embodiment, the concentrate compositions described herein comprise, consist of or consist essentially of at least one solvent selected from the group consisting of a ketone, a dibasic ester, a pyrrolidone, and at least one non-ionic surfactant (e.g., fluorinated polyether). In another particularly preferred embodiment, the concentrate compositions described herein comprise, consist of or consist essentially of cyclohexanone and at least one non-ionic surfactant (e.g., a fluorinated polyether). In still another particularly preferred embodiment, the concentrate compositions described herein comprise, consist of or consist essentially of 3-pentanone and at least one non-ionic surfactant (e.g., fluorinated polyether). In each particularly preferred embodiment, the concentrate composition may further include a glycol ether, preferably a propylene glycol ether such as dipropylene glycol propylene ether (DPGPE), to raise the flash point of the composition. As such, the concentrate compositions may comprise, consist of or consist essentially of at least one ketone, at least one glycol ether, and at least one non-ionic surfactant (e.g., fluorinated polyether), wherein the at least one ketone preferably is cyclohexanone and/or 3-pentanone. In a particularly preferred embodiment, a concentrate of the composition includes about 98.5 to about 99.9 wt % of at least one ketone and about 0.1 to about 1.5 wt % of at least one non-ionic surfactant (e.g., fluorinated polyether), and the concentrate is diluted with a second organic solvent to raise the flash point, wherein the weight ratio of concentrate to second organic solvent is in a range from about 1:4 to about 1:1, preferably about 1:2.

In another particularly preferred embodiment, the concentrate compositions described herein comprise, consist of or consist essentially of at least one ester and at least one non-ionic surfactant (e.g., fluorinated polyether), preferably a dibasic ester and/or dimethyl adipate in combination with a fluorinated polyether. In still another preferred embodiment, the concentrate compositions described herein, comprise, consist of or consist essentially of at least one carbonate, such as butylene carbonate and/or propylene carbonate, and at least one non-ionic surfactant (e.g., fluorinated polyether), preferably butylene carbonate or propylene carbonate in combination with a fluorinated polyether. In yet another preferred embodiment, the concentrate compositions described herein, comprise, consist of or consist essentially of at least one pyrrolidinone, such as 1-cyclohexyl-2-pyrrolidinone, and at least one non-ionic surfactant (e.g., fluorinated polyether), preferably 1-cyclohexyl-2-pyrrolidinone in combination with a fluorinated polyether. In another particularly preferred embodiment, a concentrate of the composition includes about 95 to about 99.9 wt % of at least one ester and/or carbonate and about 0.1 to about 5 wt % of at least one non-ionic surfactant.

In still another preferred embodiment, the concentrate compositions comprise, consist of or consist essentially of at least one organic solvent, a first non-ionic surfactant, and a second non-ionic surfactant, wherein the first non-ionic surfactant has an HLB greater than about 10 and the second non-ionic surfactant has an HLB less than about 10. For the purposes of this application, the combination of a first non-ionic surfactant has an HLB greater than about 10 and the second non-ionic surfactant has an HLB less than about 10 will hereinafter be referred to as the "co-surfactant system." The weight ratio of first non-ionic surfactant to second non-ionic surfactant is in a range from about 10:1 to about 1:10, preferably about 2:1 to about 0.5:1, most preferably about 1.5:1 to about 0.75:1. Exemplary co-surfactant systems include the combination of polysorbate surfactants (e.g., polyoxyethylene sorbitan monooleate (HLB=15)) and sorbitan ester surfactant (e.g., sorbitan monooleate (HLB=4.3)) having a weight ratio of about 1:1. Exemplary organic solvents include dibasic esters, glycerine carbonate and butylene carbonate. For example, the concentrate may comprise, consist of or consist essentially of a carbonate, a polysorbate surfactant and a sorbitan ester surfactant, e.g., butylene carbonate, polyoxyethylene sorbitan monooleate and sorbitan monooleate. Alternatively, the concentrate may comprise, consist of or consist essentially of a dibasic ester, a polysorbate surfactant and a sorbitan ester surfactant, e.g., DBE6, polyoxyethylene sorbitan monooleate and sorbitan monooleate. Said concentrates may be diluted with water or ultra pure water (UPW) for the cleaning of contaminant material from the components of lithographic apparatuses.

In yet another preferred embodiment, the concentrate compositions comprise, consist of or consist essentially of at least two organic solvents and the co-surfactant system. Exemplary organic solvents include dibasic esters, glycerine carbonate, butylene carbonate, and combinations thereof, preferably a dibasic ester and glycerine carbonate. For example, the concentrate may comprise, consist of or consist essentially of a dibasic ester, a carbonate, a polysorbate surfactant and a sorbitan ester surfactant, e.g., DBE6, glycerine carbonate, polyoxyethylene sorbitan monooleate and sorbitan monooleate. Said concentrate may be diluted with water or UPW for the cleaning of contaminant material from the components of lithographic apparatuses.

The pH of the compositions described herein are preferably near neutral so as to be compatible with the materials of construction and are preferably about 5 to about 9, more preferably about 6 to about 8. It should be appreciated that the pH may be less than 5 or greater than 9 when the materials are not substantially affected by highly acidic or highly basic compositions.

The amount of each component in the concentrate compositions described herein are as follows:

| Component | preferably | more preferably | most preferably |
| --- | --- | --- | --- |
| organic solvent(s) | about 10 to about 99.99 wt % | about 50 to about 99.99 wt % | about 90 to about 99.9 wt % |
| surfactant(s) | about 0.01 to about 5 wt % | about 0.01 to about 5 wt % | about 0.1 to about 5 wt % |
| optional added water | 0 to about 90 wt % | 0 to about 50 wt % | 0 to about 10 wt % |

The concentrate compositions described herein are substantially devoid of any one of or any various combination of: abrasive material; supercritical fluids; photoresist precursors; alkaline substances such as inorganic alkalis, primary, secondary and tertiary amines, alcoholamine, amides and quaternary ammonium salts; thickeners such as cellulose derivatives, clays and oils; lipids; activators such as ammonium hydroxide, monoethanolamine, formic acid, acetic acid, and oxalic acid; antioxidants; phosphates and phosphate-containing compounds; surfactant compounds of the general formula R—[O-(AO)$_n$]$_m$—Z as disclosed in U.S. Patent Application Publication No. 20030196685, which is hereby incorporated by reference herein in its entirety, where n=1-200, m=1-3, R is a hydrophobe, AO is a hydrophile and Z is a nonionic or anionic capping group; the surfactants represented by Formulas I-X of U.S. Patent Application Publication No. 20040204328, which is hereby incorporated by reference herein in its entirety, and combinations thereof.

In another embodiment, the aforementioned concentrate compositions further include at least one plasticizer. Although not wishing to be bound by theory, it is thought that the presence of the plasticizer in the composition enhances the material compatibility of the cleaning compositions for elastomer-based construction materials. Exemplary plasticizers include, but are not limited to, bis(2-ethylhexyl) sebacate, dioctyl terephthalate, and bis(1-butylphenyl) adipate, preferably dioctyl terephthalate. When present, the concentration of plasticizer in the diluted composition is preferably in a range from about 0.001 wt % to about 1 wt. %.

In still another embodiment, the aforementioned concentrate compositions further include contaminant material from the components of the lithographic apparatus that is cleaned. For example, the concentrate composition may include at least one organic solvent and at least one non-ionic surfactant, and contaminant material. In another embodiment, the concentrate composition may include at least one species selected from the group consisting of a ketone, an ester, a carbonate, and combinations thereof, at least one non-ionic surfactant, and contaminant material. In yet another embodiment, the concentrate composition may include at least one alkylene carbonate, at least one non-ionic surfactant, at least one glycol ether, and contaminant material. The contaminant material may be dissolved and/or suspended in the concentrate composition.

The concentrate compositions may be readily formulated as single-package formulations or multi-part formulations that are mixed at or before the point of use, e.g., the individual parts of the multi-part formulation may be mixed at the tool, in a storage tank upstream of the tool, or in a shipping package that delivers the mixed formulation directly to the tool. For example, a single shipping package may include at least two separate containers or bladders that may be mixed together by a user at the fab and the mixed formulation may be delivered directly to the tool. The shipping package and the internal containers or bladders of the package must be suitable for storing and shipping said composition components, for example, packaging provided by Advanced Technology Materials, Inc. (Danbury, Conn., USA).

Another aspect relates to the dilution of a concentrated composition. Preferably, upon dilution, an emulsion is formed although it should be appreciated that the diluted composition is not necessarily emulsified. The concentrate composition may be combined with at least one diluent to effectuate cleaning contaminant material from components of a lithographic apparatus. The concentrate composition may be combined with the at least one diluent upstream or at the site of cleaning. Alternatively, the individual components of the concentrate composition and the at least one diluent are combined at the site of cleaning. Dilution can be in a range from about 1:1 to about 100:1 diluent(s):concentrate, preferably about 5:1 to about 45:1, and more preferably about 10:1 to about 40:1, although it should be appreciated that the dilution is solubility dependent. Most preferably, an emulsion is formed upon the combination of at least one diluent and the concentrate composition, with or without mechanical or turbulent mixing based on energies of formation. Upon formation, the emulsion preferably contains microdroplets of pure concentrated composition in the diluent, wherein the concentrate is immiscible in said diluent and the emulsion is opaque (i.e., cloudy). The at least one diluent comprises a species selected from the group consisting of any applicable immersion liquid (high refractive index medium) e.g., water, highly purified water, iodated organics and composite fluids comprising nanocrystals, preferably highly purified water.

The combination of co-surfactants, specifically a non-ionic surfactant having an HLB greater than 10 and a non-ionic surfactant having an HLB less than 10, assists in stabilizing the emulsion for extended periods of time, e.g., greater than 30 minutes, preferably greater than 60 minutes, more preferably greater than 120 minutes and most preferably upwards of about 180 minutes. Alternatively, or in addition to the co-surfactant system, the emulsion may further comprise at least one stabilizing agent to stabilize said emulsion for extended periods of time, e.g., in a range from about 5 minutes to about 480 minutes. The at least one stabilizing agent can comprise a co-surfactant such as a non-hydroxy-terminated non-ionic surfactants, polyvinyl alcohols, ethers, pyrrolidones, monoglycerides, and combinations thereof. Preferably, the emulsion permits a photoresist removal rate of greater than about 1.0 Å sec$^{-1}$, more preferably greater than about 1.5 Å sec$^{-1}$, and a top coat removal rate of greater than about 0.5 Å sec$^{-1}$.

Another aspect relates to a kit including, in one or more containers, one or more components adapted to form the concentrate compositions, as described herein. The containers of the kit must be suitable for storing and shipping said compositions, for example, NOWPak® containers (Advanced Technology Materials, Inc., Danbury, Conn., USA). The one or more containers which contain the components of the concentrate compositions described herein preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended concentrate composition to a process tool.

Substantially chemically inert, impurity-free, flexible and resilient polymeric film materials, such as PTFE or PFA, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials includes films comprising virgin polytetrafluoroethylene (PTFE), PTFA, Halar®, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" International Application No. PCT/US08/63276 entitled "SYSTEMS AND METHODS FOR MATERIAL BLENDING AND DISTRIBUTION" filed on May 9, 2008 in the name of John E. Q. Hughes; and International Application No. PCT/US08/85826 entitled "SYSTEMS AND METHODS FOR DELIVERY OF FLUID-CONTAINING PROCESS MATERIAL COMBINATIONS" filed on Dec. 8, 2008 in the name of John E. Q. Hughes et al.

In another aspect, the concentrate compositions described herein are useful for cleaning contaminant material from components of a lithographic apparatus, wherein the concentrate composition or the emulsion is contacted with the component for a time of from about 10 sec to about 480 minutes, at temperature in a range of from about 10° C. to about 100° C. Such contacting times and temperatures are illustrative, and any other suitable time and temperature conditions may be employed that are efficacious to at least partially clean the contaminant material from the lithographic apparatus components. "At least partially clean" and "substantial removal" both correspond to at removal of at least 85% of the contaminants present on the component prior to removal, more preferably at least 90%, even more preferably at least 95%, and most preferred at least 99%. Contact of the concentrate composition or the emulsion with the components of the lithographic apparatus may be achieved using mechanical means such as, but not limited to, built-in fluid supply discharge systems and ultrasonic transducers, and may alternatively be coupled with additional devices such as ozone generators and $CO_2$ compressors for performance enhancement.

As applied to the cleaning of contaminant material from the components of lithographic apparatuses, the compositions (i.e., concentrate or emulsion) described herein are usefully employed to clean contaminant materials from said components. Preferably the compositions remove at least 85% of the contaminant material present on the components prior to cleaning, more preferably at least 90%, even more preferably at least 95%, and most preferably at least 99%.

In cleaning application, the concentrate composition or emulsion, formed in-situ or ex-situ, is applied in any suitable manner to the lithographic apparatus components having contaminant material thereon, e.g., in situ application wherein the apparatus has not been substantially disassembled, or application of the concentrate composition or emulsion to the components following disassembly of the lithographic apparatus. When performing an in situ clean, a "dummy wafer" can be positioned in the immersion hood, wherein the dummy wafer is a blank wafer or alternatively comprises a substantially hydrophobic surface, e.g., polypropylene and polytetrafluoroethylene (PTFE). A dummy wafer having high water contact angles (for example, greater than 90°) will increase the efficiency of meniscus containment during cleaning of the immersion apparatus.

Following the achievement of the desired removal action, the composition can be readily removed from the components to which it has previously been applied using a rinse solution, wherein the rinse solution preferably comprises water, more preferably ultrapure water.

It should be appreciated by one skilled in the art that although reference is made to the removal of contaminants from lithographic apparatus components, the concentrates and emulsions described herein may be used for the removal of polymeric materials from other semiconductor manufacturing apparatuses as well as wafers having polymeric material (e.g., photoresist) thereon.

In another aspect, a method for selecting solvents or combinations thereof using known solubility parameters or known chemical descriptors is described. In said method, the dissolution rate of polymeric materials in various solvents having known solubility parameters or known chemical descriptors is determined and said dissolution rates may be programmed into a computer along with solubility parameters and chemical descriptors, to correlate the solubility values and chemical descriptors with the dissolution rates, wherein solvents useful for cleaning polymeric materials from surfaces may be readily selected as a function of solubility values and chemical descriptors. Chemical descriptors include, but are not limited to, constitutional descriptors, topological descriptors, geometrical descriptors, charge distribution related descriptors, molecular orbital related descriptors, temperature dependent descriptors, and solvation descriptors.

As will be appreciated by one of skill in the art, the method of this aspect may be embodied as a method, system, computer program product, or a combination of the foregoing. Accordingly, embodiments of this aspect may take the form of an entirely hardware embodiment, an entirely software embodiment (including firmware, resident software, microcode, etc.), or an embodiment combining software and hardware aspects that may generally be referred to herein as a "system." Furthermore, embodiments of this aspect may take the form of a computer program product on a computer-readable medium having computer-usable program code embodied in the medium.

Any suitable computer-readable medium may be utilized. The computer-readable medium may include, but is not limited to, an electronic, magnetic, optical, electromagnetic, infrared, or semiconductor system, apparatus, or device. More specific examples of the computer-readable medium include, but are not limited to, an electrical connection having one or more wires; a tangible storage medium such as a portable computer diskette, a hard disk, a random access memory (RAM), a read-only memory (ROM), an erasable programmable read-only memory (EPROM or Flash memory), a compact disc read-only memory (CD-ROM), or other optical or magnetic storage device. In the context of this document, a computer-readable medium may be any medium that can contain, store, communicate, or transport the program for use by or in connection with the instruction execution system, apparatus, or device.

Computer program code for carrying out operations of embodiments of this aspect may be written in an object-oriented, scripted or unscripted programming language such as Java, Perl, Smalltalk, C++, or the like. However, the computer program code may also be written in conventional procedural programming languages, such as the "C" programming language or similar programming languages.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition comprising at least one organic solvent and at least one non-ionic surfactant, wherein the at least one non-ionic surfactant comprises a mixture of sorbitan ester and polysorbate surfactant and wherein the at least one organic solvent comprises a species selected from the group consisting of 3-pentanone, acetone, 5-hydroxy-2-pentanone, 4-hydroxy-4-methyl-2-pentanone, butanone, 2-methyl-2-butanone, 4-hydroxy-2-butanone, cyclopentanone, 2-pentanone, 1-phenylethanone, benzophenone, 2-hexanone, 3-hexanone, 2-heptanone, 4-heptanone, ethyl n-butyl ketone, ethyl n-amyl ketone, dicyclohexyl ketone, 2,6-dimethylcyclohexanone, 2-acetylcyclohexanone, dimethyl adipate, dimethyl succinate, diethyl phthalate, diethyl succinate, dibutyl succinate, diethyl adipate, diethyl glutarate, dibutyl phthalate, diethyl tartarate, butylene carbonate, glycerine carbonate, and combinations thereof.

2. The composition of claim 1, wherein the pH of the composition is about 5 to about 9.

3. The composition of claim 1, wherein the sorbitan ester comprises a species selected from the group consisting of sorbitan monolaurate, sorbitan monopalmitate, sorbitan monostearate, sorbitan tristearate, sorbitan monooleate, and sorbitan trioleate.

4. The composition of claim 1, wherein the at least one organic solvent comprises a carbonate selected from a group consisting of butylene carbonate, glycerine carbonate, and combinations thereof.

5. The composition of claim 1, wherein the polysorbate surfactants are selected from the group consisting of polyoxyethylene (20) sorbitan monolaurate, polyoxyethylene (20) sorbitan monopalmitate, polyoxyethylene (20) sorbitan monostearate, polyoxyethylene (20) sorbitan monooleate, polyoxyethylene sorbitan trioleate, and polyoxyethylene sorbitan tristearate.

6. The composition of claim 1, wherein the at least one non-ionic surfactant comprises a first non-ionic surfactant having an HLB greater than 10 and a second non-ionic surfactant having an HLB less than 10.

7. The composition of claim 1, further comprising at least one of a glycol ether, water, and a plasticizer.

8. The composition of claim 1, wherein the composition further comprises at least one diluent to form a diluted composition, wherein the at least one diluent comprises a species selected from the group consisting of water, highly purified water, iodated organics, and composite fluids comprising nanocrystals.

9. The composition of claim 1, wherein the composition further comprises contaminant material.

10. A method of removing contaminant material from a component of a lithographic apparatus having said contaminant material thereon, said method comprising contacting a composition with said component to remove said contaminant material from said component, wherein the composition comprises at least one organic solvent and at least one non-ionic surfactant, wherein the at least one non-ionic surfactant comprises a mixture of sorbitan ester and polysorbate surfactant, and wherein the at least one organic solvent comprises a species selected from the group consisting of 3-pentanone, acetone, 5-hydroxy-2-pentanone, 4-hydroxy-4-methyl-2-pentanone, butanone, 2-methyl-2-butanone, 4-hydroxy-2-butanone, cyclopentanone, 2-pentanone, 1-phenylethanone, benzophenone, 2-hexanone, 3-hexanone, 2-heptanone, 4-heptanone, ethyl n-butyl ketone, ethyl n-amyl ketone, dicyclohexyl ketone, 2,6-dimethylcyclohexanone, 2-acetylcyclohexanone, dimethyl adipate, dimethyl succinate, diethyl phthalate, diethyl succinate, dibutyl succinate, diethyl adipate, diethyl glutarate, dibutyl phthalate, diethyl tartarate, butylene carbonate, glycerine carbonate, and combinations thereof.

11. The composition of claim 8, wherein the diluted composition is an emulsion, which could be generated in-situ or ex-situ by mixing with any applicable immersion liquids.

12. The method of claim 10, wherein the pH of the composition is about 5 to about 9.

13. The method of claim 10, wherein the at least one organic solvent comprises a carbonate selected from a group consisting of butylene carbonate, glycerine carbonate, and combinations thereof.

14. The method of claim 10, wherein the at least one non-ionic surfactant comprises a first non-ionic surfactant having an HLB greater than 10 and a second non-ionic surfactant having an HLB less than 10.

15. The composition of claim 1, wherein the composition is substantially devoid of any one of: abrasive material; supercritical fluids; photoresist precursors; alkaline substances; thickeners; lipids; activators; antioxidants; phosphates and phosphate-containing compounds; and surfactant compounds of the general formula $R-[O-(AO)_n]_m-Z$.

16. A composition comprising at least one organic solvent and at least one non-ionic surfactant, wherein the at least one non-ionic surfactant comprises a surfactant selected from the group consisting of polyoxyethylene-polyoxypropylene block co-polymers, castor oil ethoxylates, fatty acid ethoxylates, alkyl ethoxylates, alkylphenyl ethoxylates, polyoxyethyleneglycol dodecyl ethers, a sucrose ester, a glycerol monofatty acid ester, a fatty acid ester of polyethylene glycol, a polyethoxylated sorbitan fatty acid ester, an alkylglycoside, an alkylpolyside, polyvinyl alcohols, monoglycerides, sorbitan esters, polysorbate surfactants, as well as combinations comprising at least one of the foregoing, and wherein the at least one organic solvent comprises a species selected from the group consisting of butylene carbonate, glycerine carbonate, and combinations thereof.

* * * * *